United States Patent
Inoue

(10) Patent No.: US 7,511,592 B2
(45) Date of Patent: Mar. 31, 2009

(54) SWITCH CIRCUIT AND INTEGRATED CIRCUIT

(75) Inventor: Yusuke Inoue, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 294 days.

(21) Appl. No.: 11/362,506

(22) Filed: Feb. 27, 2006

(65) Prior Publication Data

US 2007/0075589 A1 Apr. 5, 2007

(30) Foreign Application Priority Data

Sep. 30, 2005 (JP) ............................. 2005-287721

(51) Int. Cl.
*H01P 1/15* (2006.01)
(52) U.S. Cl. ...................................... 333/104
(58) Field of Classification Search ................. 333/101, 333/4, 5, 103, 104, 262, 26
See application file for complete search history.

(56) References Cited

U.S. PATENT DOCUMENTS

| 5,159,297 | A | * | 10/1992 | Tateno | 333/104 |
| 5,519,364 | A | * | 5/1996 | Kato et al. | 333/103 |
| 5,856,713 | A | * | 1/1999 | Huettner et al. | 307/125 |
| 5,990,580 | A | | 11/1999 | Weigand | |
| 6,737,933 | B2 | * | 5/2004 | Nyberg | 333/81 R |
| 6,798,314 | B2 | * | 9/2004 | Nation | 333/104 |

FOREIGN PATENT DOCUMENTS

| DE | 199 09 521 A1 | 9/1999 |
| JP | 06-232601 A | 8/1994 |
| JP | 2000-077903 A | 3/2000 |
| JP | 2000-286601 A | 10/2000 |
| JP | 2002-164704 A | 6/2002 |
| JP | 2003-142931 | 5/2003 |
| JP | 2003-142981 A | 5/2003 |
| JP | 2003-143033 | 5/2003 |
| JP | 2003-143033 A | 5/2003 |

\* cited by examiner

*Primary Examiner*—Benny Lee
*Assistant Examiner*—Alan Wong
(74) *Attorney, Agent, or Firm*—Arent Fox LLP

(57) ABSTRACT

A switch circuit includes a balanced line connected between one end of an unbalanced line having another end connected to an input terminal and an output terminal and a balanced line connected between the one end of the unbalanced line and an output terminal. On each of the balanced lines, a plurality of quarter-wave transmission lines are connected in cascade, and each of a plurality of FETs, whose impedance is controllable, is connected between one pair of transmission lines constituting a balanced line for each interconnection point between the transmission lines, so that the power of a signal is distributed to both of the pair of transmission lines, and therefore the inputted power becomes half on each balanced line, thereby making it possible to prevent a DC-like current from flowing when the FET is in an off state even if a high frequency signal with high power is inputted.

9 Claims, 8 Drawing Sheets

F I G. 3
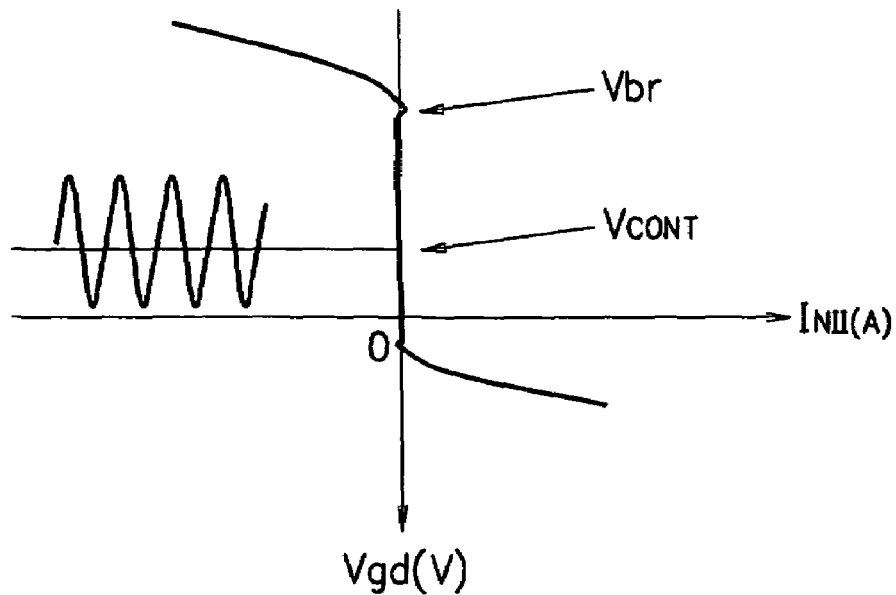
F I G. 4
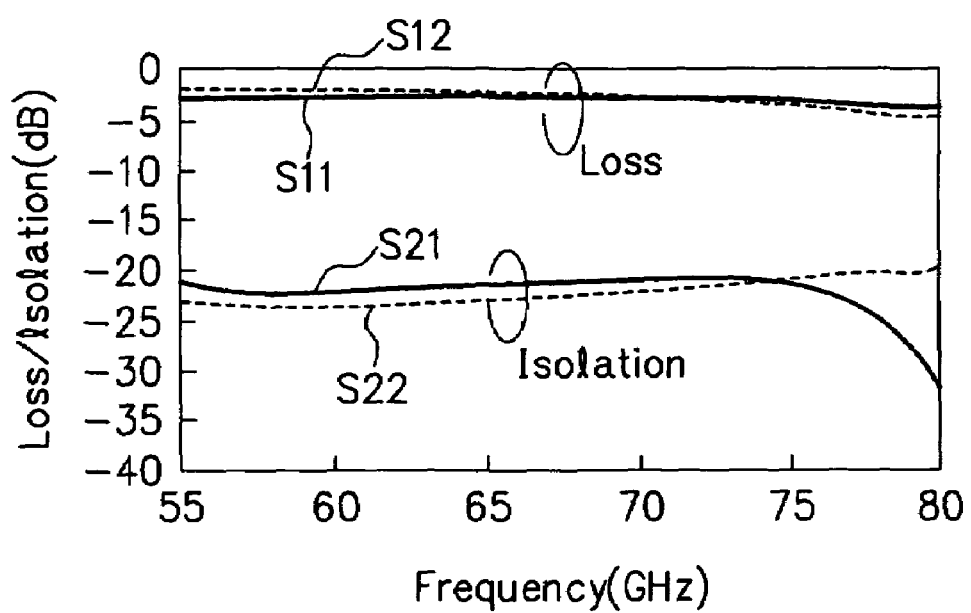

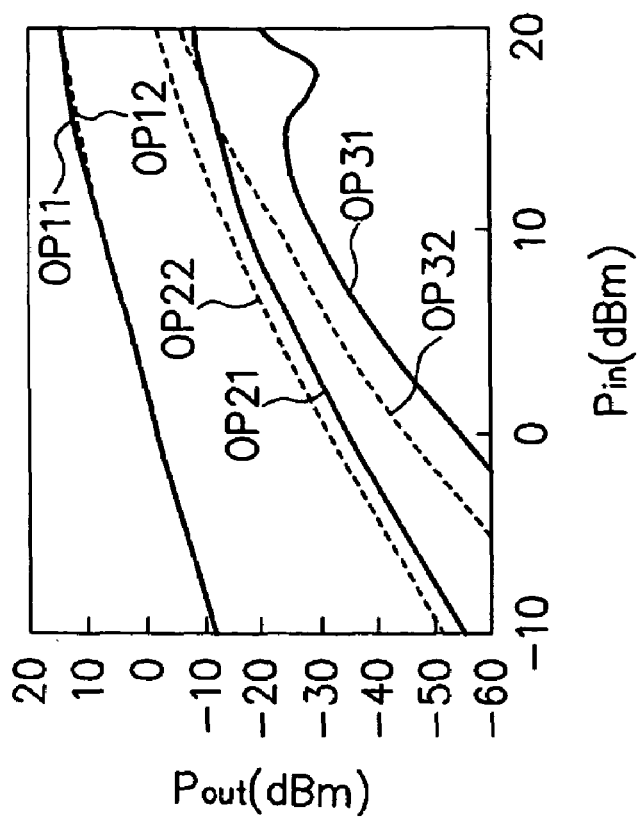
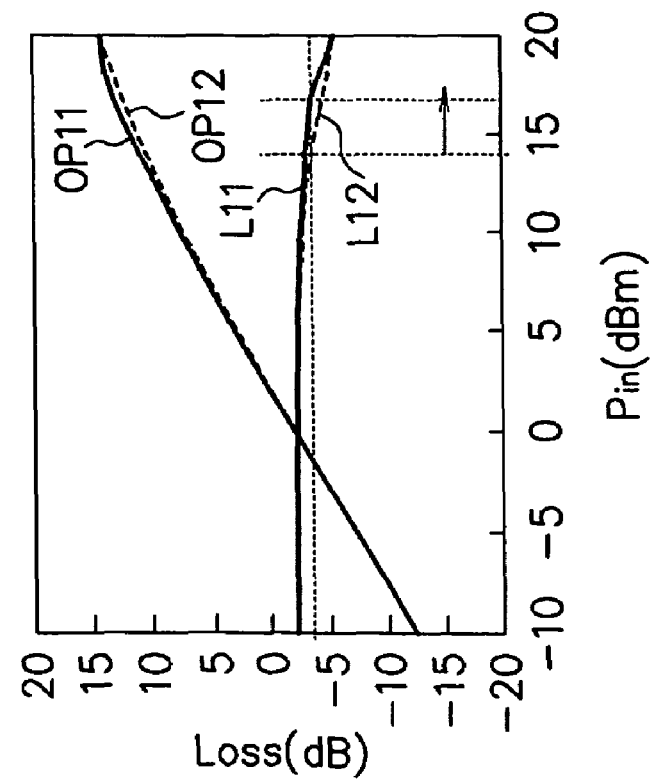

F I G. 6
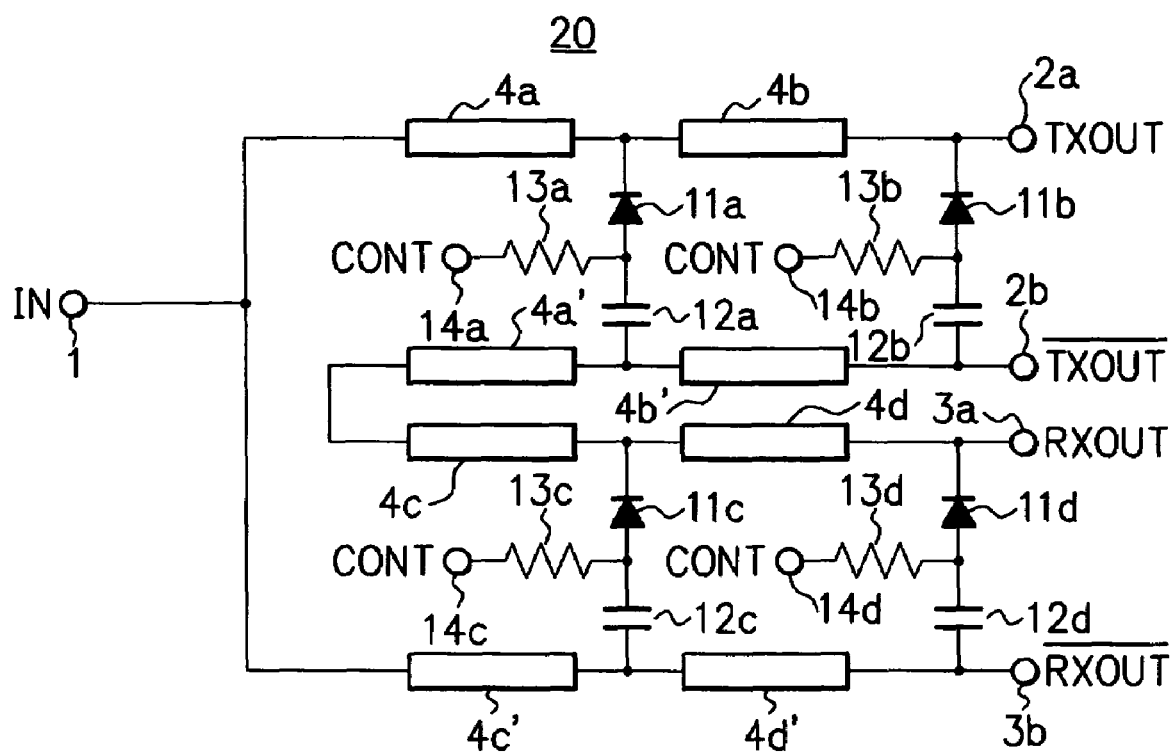

| | HIGH FREQUENCY OPERATION | HIGH WITHSTAND VOLTAGE OPERATION |
|---|---|---|
| InP HEMT | ○ | × |
| InP HBT | ○ | △ |
| SiGe HBT | ○ | △ |
| CMOS | △ | × |
| GaN HEMT | △ | ○ |
| GaAs pHEMT | △ | △ |

SWITCH CIRCUIT AND INTEGRATED CIRCUIT

CROSS-REFERENCE TO RELATED APPLICATIONS

This application is based upon and claims the benefit of priority from the prior Japanese Patent Application No. 2005-287721, filed on Sep. 30, 2005, the entire contents of which are incorporated herein by reference.

BACKGROUND OF THE INVENTION

1. Field of the Invention

The present invention relates to a switch circuit and an integrated circuit and particularly to a circuit preferably used for a high frequency switch circuit used in a high frequency band.

2. Description of the Related Art

In recent years, with the coming of an advanced information society, communication systems such as a wireless LAN and a cellular phone using the high frequency wireless communication technology has come into practical use. To constitute such a communication system, there is a growing demand for high-performance microwave components. For example, in order to realize the communication system with the wireless LAN at a low cost, a module in which a transmitter and a receiver are integrated is under development, which still requires realization of an SPDT (Single Pole Dual Throw) switch capable of handling high power. Further, an apparatus handling a high frequency signal with very high output such as a DUPLEXER used in a base station of a third-generation cellular phone requires a switch element with high withstand voltage and low loss.

For such switches, mechanical switches such as MEMS (Micro Electro Mechanical Systems) have been conventionally used. However, because the mechanical switch wears, it is conceivable that the switch is shifted from the mechanical switch to a switch circuit using a semiconductor element having a high withstand voltage in consideration of reliability, cost, and so on. Recently, to meet the application demands, semiconductor elements are under development which are excellent in high-voltage resistance characteristics, such as an HEMT (high electron mobility transistor) using SiC (silicon carbide) or GaN (gallium nitride). Moreover, a high frequency switch circuit is also being developed, in parallel, which uses a semiconductor element with low distortion operating at a high frequency such as a microwave band and applicable in the wireless communication system such as a wireless LAN and a cellular phone.

For example, as a switch circuit used at a high frequency band, an impedance transformation-type switch circuit is known in which each path uses a configuration in which quarter-wave transmission lines are connected in cascade and an FET (field effect transistor) is connected to an interconnection between the lines (see, for example, Non-Patent Document 1). Furthermore, a switch circuit is proposed which has a balanced/unbalanced conversion function (see, for example, Patent Documents 1 and 2).

The high frequency switch circuit is required to have excellent distortion characteristics in order to meet the demand of the applications such as the wireless LAN and cellular phone. In a conventional high frequency switch circuit, however, it is difficult to achieve sufficiently low distortion characteristics.

FIG. 10 is a diagram showing a circuit configuration of a conventional high frequency switch circuit. In the high frequency switch circuit 100, a path starts from an input terminal (IN) 1 and branches out into two paths which are connected to a transmitting side output terminal (TXOUT) 2 and a receiving side output terminal (RXOUT) 3. On a transmitting side path (the path between the input terminal 1 and the transmitting side output terminal 2), transmission lines 4a and 4b each having a line length of a quarter of a wavelength ($\lambda/4$) are connected in series between the input terminal 1 and the transmitting side output terminal 2, and FETs 5a and 5b are connected in parallel to contact points between them. Similarly, on a receiving side path (the path between the input terminal 1 and the receiving side output terminal 3), transmission lines 4c and 4d each having a line length of a quarter of a wavelength are connected in cascade between the input terminal 1 and the receiving side output terminal 3, and FETs 5c and 5d are connected in parallel to contact points between them.

The FETs 5a to 5d, which function as switches, are provided to control switching between the paths in the high frequency switch circuit 100. Drains of the FETs 5a and 5b are connected to an interconnection point between the transmission lines 4a and 4b and an interconnection point between the transmission line 4b and the transmitting side output terminal 2, respectively. Drains of the FETs 5c and 5d are connected to an interconnection point between the transmission lines 4c and 4d and an interconnection point between the transmission line 4d and the receiving side output terminal 3, respectively. Further, sources of the FETs 5a to 5d are grounded respectively, and gates of the FETs 5a to 5d are connected to control terminals (CONTs) 6a to 6d. Control voltages are applied from the control terminals 6a to 6d to the gates of the FETs 5a to 5d to vary the impedance of the FETs 5a to 5d, thereby switching between paths in the high frequency switch circuit 100.

FIG. 11 is a diagram showing an equivalent circuit of the conventional high frequency switch circuit 100 shown in FIG. 10 at the time of transmission switching. At the time of transmission switching, the control voltages supplied via the control terminals 6a to 6d turn off the FETs 5a and 5b and turn on the FETs 5c and 5d (An off-capacitance value of the FET in use is $C_{off}$, and an on-resistance value is $R_{ON}$.)

In this event, as shown in FIG. 11, the on-resistance $R_{ON}$ is selected to be a sufficiently small value on the receiving side path, and therefore the impedance when viewing a node N22 from a node N21 is high, so that a high frequency signal cannot reach the receiving side output terminal 3. On the other hand, the off-resistance $R_{off}$ is selected to be a sufficiently small value on the transmitting side path, and therefore the impedance when viewing the ground from a node N11 is high, so that a high frequency signal reaches the transmitting side output terminal 2 without loss.

FIG. 12 is a diagram showing a schematic sectional view of an FET generally used in the prior art. In FIG. 12, numeral 120 denotes a substrate (for example, InP), 121 denotes a buffer layer, 122 denotes a (high purity) channel layer, and 123 denotes a carrier supply layer. Further, S denotes a source electrode, G denotes a gate electrode, and D denotes a drain electrode. To use a transistor with a frequency equal to or higher than the micro wave here, it is necessary to make a distance $L_{sg}$ between the source electrode S and the gate electrode G and a distance $L_{gd}$ between the gate electrode G and the drain electrode D sufficiently small in order to reduce the on-resistance $R_{ON}$.

However, if the distances $L_{sg}$ and $L_{gd}$ are made small, the breakdown voltage of the transistor becomes low, presenting the following problem. FIG. 13 is a chart showing variations in a gate-drain (GD) voltage Vgd of the FET 5a where a high frequency signal with high power is supplied from the transmitting side output terminal 2 when the FET 5a is in an off state, and the relation between the voltage Vgd and a current $I_{N11}$ flowing from the FET 5a to the node N11 with the variations, in the high frequency switch circuit 100 shown in FIG. 10.

When the distances $L_{sg}$ and $L_{gd}$ are small, a breakdown voltage Vbr of the FET is small to fail to increase a control voltage $V_{CONT}$ to be supplied to the gate terminal via the control terminal. Therefore, as shown in FIG. 13, at the time of inputting a high frequency signal with high power, the GD voltage Vgd of the FET 5a shifts to the positive side (a broken line 130 shown in FIG. 13), so that current flows between the drain and the source (DS) of the FET 5a.

In other words, it is preferable that in the high frequency switch circuit 100 as shown in FIG. 10, no DC-like current flows to the FET when it is in an off state, but a DC-like current flows at the time of inputting a high frequency signal with high power. This greatly deteriorates distortion characteristics of a high frequency switch circuit. Accordingly, it is impossible to obtain excellent distortion characteristics in the conventional high frequency switch circuit.

(Patent Document 1)
  Japanese Patent Application Laid-open No. 2003-143033

(Patent Document 2)
  Japanese Patent Application Laid-open No. 2003-142931

(Non-Patent Document 1)
  Y. Ayasli, R. A. Pucel, J. L. Vorhaus, and W. Fabian, "A monolithic X-band single-pole, double-throw bi-directional GaAs FET switch", Proc. IEEE GaAs IC Symp., paper no. 21, 1980

SUMMARY OF THE INVENTION

An object of the present invention is to provide a switch circuit with high-voltage resistance characteristics and excellent distortion characteristics.

A switch circuit of the present invention includes a first balanced line connected between one end of an unbalanced line having another end connected to an input terminal and a first output terminal, and a second balanced line connected between the one end of the unbalanced line and a second output terminal. On each of the balanced lines, a plurality of quarter-wave transmission lines are connected in cascade, and each of a plurality of controlled circuits is connected between one pair of transmission lines constituting the balanced line for each interconnection point between the transmission lines, an impedance of the controlled circuit being controllable.

According to the above configuration, the power of a signal is distributed to both of the pair of transmission lines on each balanced line and therefore the net inputted power is half as compared to the case using an unbalanced line as in the prior art.

BRIEF DESCRIPTION OF THE DRAWINGS

FIG. 3 is a chart showing the relation between the voltage applied to a transistor used in the high frequency switch circuit shown in FIG. 1 and the current flowing through the transistor;

FIG. 4 is a chart showing characteristics (isolation and loss) of the high frequency switch circuit in this embodiment;

FIG. 5A and FIG. 5B are charts each showing characteristics of the high frequency switch circuit at the time of inputting a signal with high power in this embodiment;

FIG. 6 is a diagram showing another circuit configuration example of the high frequency switch circuit in this embodiment;

DETAILED DESCRIPTION OF THE PREFERRED EMBODIMENTS

Hereinafter, embodiments of the present invention will be described with reference to the drawings.

Figure 1:
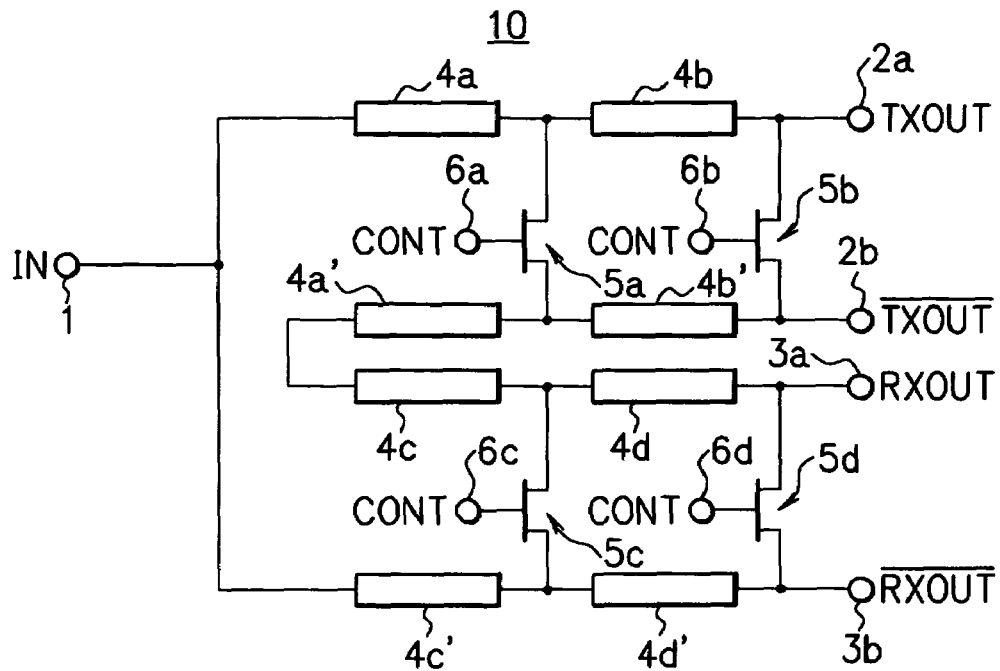
FIG. 1 is a diagram showing a circuit configuration example of a high frequency switch circuit in an embodiment of the present invention.

FIG. 1 is a diagram showing a circuit configuration example of a high frequency switch circuit 10 being one example of a switch circuit according to an embodiment of the present invention. The high frequency switch circuit 10 is a switch circuit operable within a high frequency region and has, as shown in FIG. 1, balanced transmission lines 4a, 4a', 4b, 4b', 4c, 4c', 4d and 4d' and field effect transistors (FETs) 5a, 5b, 5c, and 5d.

The high frequency switch circuit 10 further includes an input terminal (IN) 1, transmitting side output terminals (TX-OUT, /TXOUT) 2a and 2b, and receiving side output terminals (RXOUT, /RXOUT) 3a and 3b. The input terminal 1 is connected through an unbalanced line and via two branched paths (two balanced transmission lines) to the transmitting side output terminals 2a and 2b and the receiving side output terminals 3a and 3b. On one of the paths, the input terminal 1 is connected to the transmitting side output terminals 2a and 2b via the unbalanced line and balanced transmission lines 4a, 4a', 4b, and 4b'. On the other path, the input terminal 1 is connected to the receiving side output terminals 3a and 3b via the unbalanced line and balanced transmission lines 4c, 4c', 4d, and 4d'.

In particular, on the one path, the transmission lines 4a and 4b each having an electric length (line length) of a quarter of a wavelength ($\lambda/4$) are connected in cascade between the input terminal 1 (mode specifically, the unbalanced line having one end connected to the input terminal 1) and the transmitting side output terminal 2a, and the transmission lines 4a' and 4b' each having an electric length of ($\lambda/4$) are connected in cascade to the transmitting side output terminal 2b. The FETs 5a and 5b are connected between line pairs of the balanced transmission line constituted of the transmission lines 4a and 4a', and 4b and 4b' respectively. More specifically, a drain electrode of the FET 5a is connected to an interconnection point between the transmission lines 4a and 4b constituting one line of the balanced line pair, and a drain electrode of the FET 5b is connected to an interconnection point between one transmission line 4b of the balanced line and the transmitting side output terminal 2a. A source electrode of the FET 5a is connected to an interconnection point between the transmission lines 4a' and 4b' constituting the other line of the balanced line pair, and a source electrode of the FET 5b is connected to an interconnection point between the other transmission line 4b' of the balanced line and the transmitting side output terminal 2b. Gate electrodes of the FETs 5a and 5b are connected to control terminals (CONTs) 6a and 6b to which control voltages are supplied, respectively.

On the other path, the transmission lines 4c and 4d each having an electric length of (λ/4) are connected in cascade to the receiving side output terminal 3a, and the transmission lines 4c' and 4d' each having an electric length of (λ/4) are connected in cascade between the input terminal 1 (more specifically, the unbalanced line having one end connected to the input terminal 1) and the receiving side output terminal 3b. The FETs 5c and 5d are connected between line pairs of the balanced transmission line constituted of the transmission lines 4c and 4c', and 4d and 4d' respectively. Drain electrodes of the FETs 5c and 5d are connected to an interconnection point between the transmission lines 4c and 4d constituting one line of the balanced line pair and an interconnection point between the transmission line 4d and the receiving side output terminal 3a, respectively. Source electrodes of the FETs 5c and 5d are connected to an interconnection point between the transmission lines 4c' and 4d' constituting the other line of the balanced line pair and an interconnection point between the transmission line 4d' and the receiving side output terminal 3b. Gate electrodes of the FETs 5c and 5d are connected to control terminals (CONTs) 6c and 6d to which control voltages are supplied, respectively.

The FETs 5a to 5d function as switches to control switching between the paths in the high frequency switch circuit 10. The high frequency switch circuit 10 shown in FIG. 1 controls the control voltages to be applied to the gate electrodes of the FETs 5a to 5d via the control terminals 6a to 6d to switch the impedances of the FETs 5a to 5d based on the gate voltages at the FETs 5a to 5d to thereby select switching between paths in the high frequency switch circuit 10.

Figure 2:
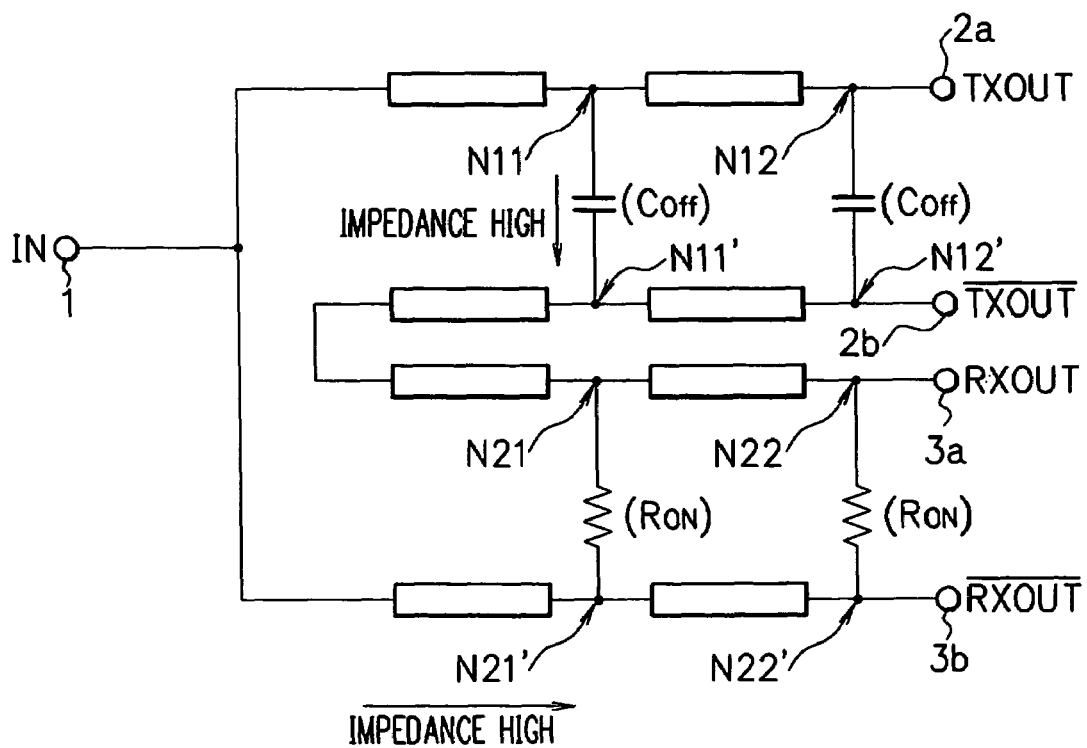
FIG. 2 is a diagram showing an equivalent circuit of the high frequency switch circuit shown in FIG. 1 at the time of transmission switching.

For example, where the path is switched to the transmitting side in the high frequency switch circuit 10 shown in FIG. 1, the equivalent circuit of the high frequency switch circuit 10 is shown in FIG. 2.

Specifically, both the FETs 5a and 5b are turned off by the control voltages supplied via the control terminals 6a and 6b, and they can be regarded as capacitive elements (off-capacitance value $C_{off}$). In this case, if the capacitance value $C_{off}$ is sufficiently small, the impedance when viewing a node N11' from a node N11 is sufficiently high also in a high frequency region, so that a high frequency signal passing through the transmitting side path reaches the input terminal 1 without loss.

Both the FETs 5c and 5d are turned on by the control voltages supplied via the control terminals 6c and 6d, and they can be regarded as resistive elements (on-resistance value $R_{ON}$). In this case, if the resistance value $R_{ON}$ is sufficiently small, the impedance when viewing a node N21' from a node N21 is sufficiently low also in the high frequency region. The electric length of each of the transmission lines 4c and 4c' is a quarter of a wavelength. Accordingly, the signal inputted into the input terminal 1 is reflected before it enters the receiving side path. In the manner as described above, when the path is switched to the transmitting side in the high frequency switch circuit 10 shown in FIG. 1, switching between unbalanced and balanced transmission modes is performed, and all signals are sent to the transmitting side circuit and transmitted therethrough.

Note that when the path is similarly switched to the receiving side in the high frequency switch circuit 10 shown in FIG. 1, the FETs 5a and 5b can be turned on and regarded as resistive elements, and the FETs 5c and 5d can be turned off and regarded as capacitive elements, so that switching between unbalanced and balanced transmission modes is performed and all signals are sent to the receiving side circuit and transmitted therethrough.

Figure 10:
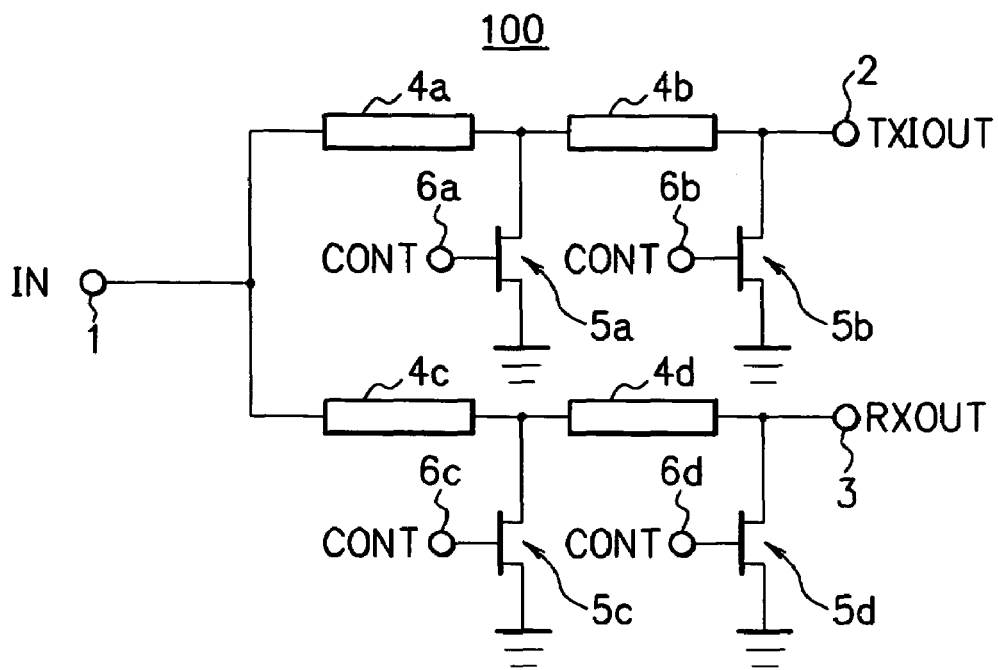
FIG. 10 is a diagram showing a circuit configuration of a conventional high frequency switch circuit.
Figure 11:
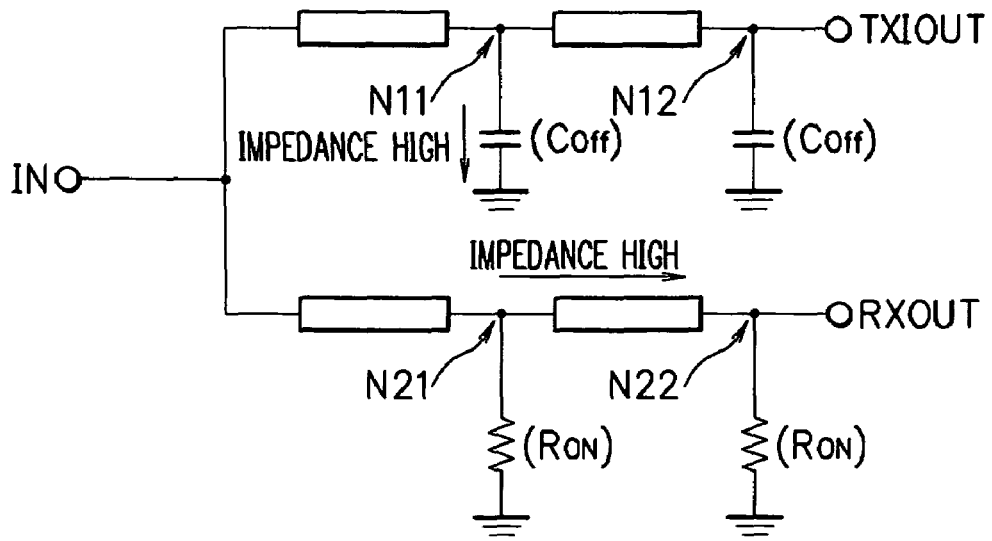
FIG. 11 is a diagram showing an equivalent circuit of the high frequency switch circuit shown in FIG. 10 at the time of transmission switching.
Figure 12:
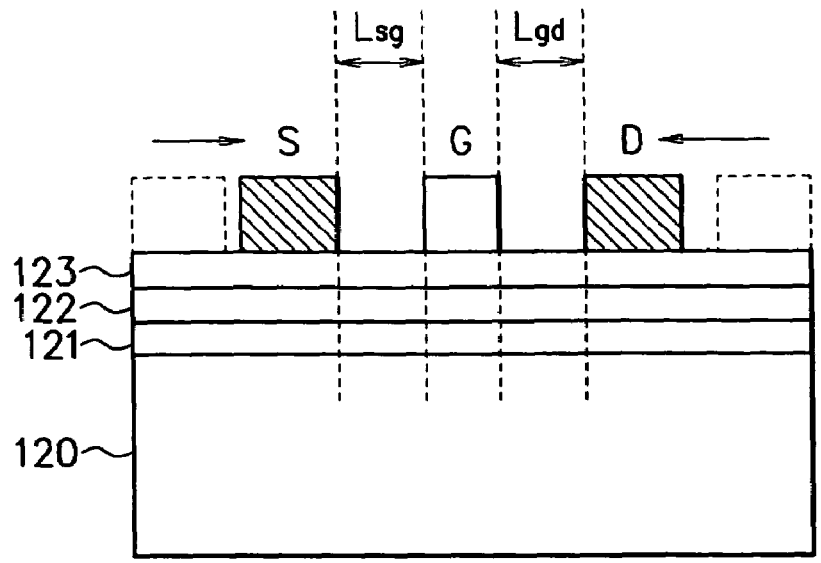
FIG. 12 is a sectional view schematically showing a transistor used in the high frequency switch circuit.
Figure 13:
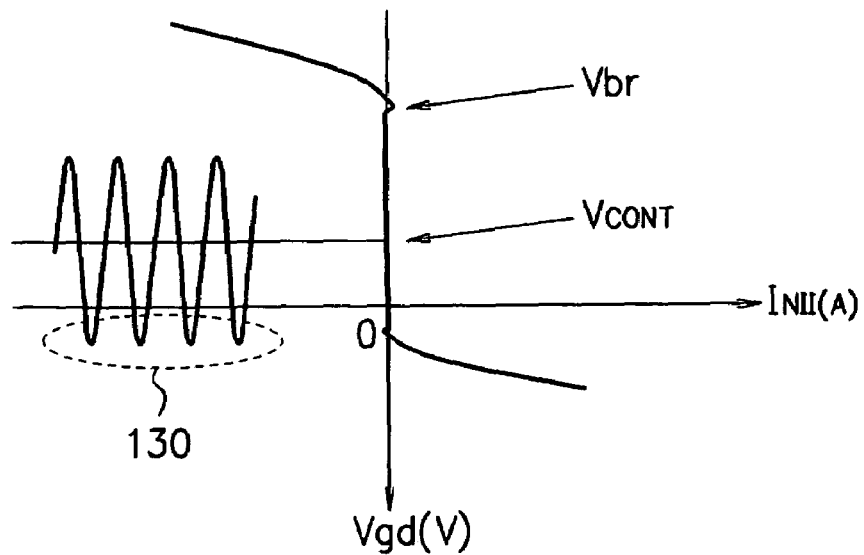
FIG. 13 is a chart showing the relation between the voltage applied to a transistor used in the high frequency switch circuit shown in FIG. 10 and the current flowing through the transistor.

A case is discussed here in which the path is switched to the transmitting side in the high frequency switch circuit 10 shown in FIG. 1, and a high frequency signal with high power passes through the transmitting side path. Unlike the conventional high frequency switch circuit shown in FIG. 10, in the high frequency switch circuit 10 shown in FIG. 1, power is distributed to both sides of a pair of the transmission lines constituting the balanced line. Accordingly, the net magnitude of amplitude of the voltage supplied by the high frequency signal at the node N11 is half the conventional one.

FIG. 3 is a chart showing variations in a gate-drain (GD) voltage Vgd of the FET 5a where a high frequency signal with high power is supplied from the transmitting side output terminals 2a and 2b when the FET 5a is in an off state, and the relation between the voltage Vgd and a current $I_{N11}$ flowing from the FET 5a to the node N11 with the variations, in the high frequency switch circuit 10 shown in FIG. 1. In FIG. 3, the horizontal axis represents the current $I_{N11}$ and the vertical axis represents the GD voltage Vgd of the FET 5a.

As described above, unlike the conventional high frequency switch circuit, in the high frequency switch circuit 10 in this embodiment, the magnitude of the voltage amplitude at the node N11 is half the conventional one. Therefore, even if a high frequency signal with high power is inputted, it is possible to prevent the GD voltage Vgd of the FET 5a from shifting to the positive side, thereby preventing a DC-like current from flowing in the off state. Consequently, the high frequency switch circuit 10 of this embodiment can be used to prevent distortion characteristics of the high frequency switch circuit from deteriorating to obtain excellent distortion characteristics.

With the high frequency switch circuit 10 of this embodiment, even if a distance $L_{sg}$ between the source electrode S and the gate electrode G and a distance $L_{gd}$ between the gate electrode G and the drain electrode D of the FET used in the high frequency switch circuit are reduced to use the circuit in a high frequency band, it is possible to prevent the GD voltage $L_{gd}$ of the FET from shifting to the positive side, thereby obtaining excellent distortion characteristics.

Next, characteristics of the high frequency switch circuit 10 in this embodiment shown in FIG. 1 will be described.

First, passage characteristics (loss characteristics) and isolation characteristics in a millimeter wave band will be described with reference to FIG. 4. FIG. 4 shows characteristics of the high frequency switch circuit 10 in this embodiment and characteristics of the conventional high frequency switch circuit 100 shown in FIG. 10 for comparison and reference.

In FIG. 4, the horizontal axis represents the frequency of a signal, and the vertical axis represents loss and isolation. Further, S11 and S21 shows the loss characteristics and the isolation characteristics of the high frequency switch circuit 10 in this embodiment respectively, and S12 and S22 shows the loss characteristics and the isolation characteristics of the conventional high frequency switch circuit 100 respectively.

FIG. 4 shows that the high frequency switch circuit 10 in this embodiment has almost the same performance as that in the prior art in the passage characteristics (loss characteristics) and the isolation characteristics.

Next, characteristics when a signal with high power is inputted will be described with reference to FIG. 5A. FIG. 5A also shows characteristics of the high frequency switch circuit 10 in this embodiment and characteristics of the conventional high frequency switch circuit 100 for comparison and reference.

In FIG. 5A, the horizontal axis represents the input power of a signal, and the vertical axis represents the output power and the loss amount (differential between the output power and the input power) of the signal. Further, in FIG. 5A, OP11 and L11 show characteristics of the high frequency switch circuit 10 in this embodiment, OP11 showing the output power according to the input power and L11 showing the loss amount according to the input power. Similarly, OP12 and L12 show characteristics of the conventional high frequency switch circuit 100, OP12 showing the output power according to the input power and L12 showing the loss amount according to the input power.

As is clear from FIG. 5A, there is no apparent difference in the passage characteristics (loss characteristics) between this embodiment and the prior art when the inputted power is low, but the difference becomes remarkable as the power increases. It is found that the gain compression when a signal with high power is inputted is greater in the high frequency switch circuit in the prior art than in that in this embodiment. In terms of Pi1 dB (an input power to increase the loss by 1 dB from the loss at the time of inputting a signal with low power) being one of indicators representing the distortion characteristics, this embodiment is improved by 3 dB as compared to the prior art.

Next, harmonic characteristics when high power is inputted will be described with reference to FIG. 5B. FIG. 5B also shows harmonic characteristics of the high frequency switch circuit 10 in this embodiment and harmonic characteristics of the conventional high frequency switch circuit 100 for comparison and reference.

In FIG. 5B, the horizontal axis represents the input power of a signal, and the vertical axis represents the output power of the signal. Further, in FIG. 5B, OP11, OP21, and OP31 show harmonic characteristics (a fundamental wave, a second harmonic, and a third harmonic, respectively) of the high frequency switch circuit 10 in this embodiment, and OP12, OP22, and OP32 show harmonic characteristics (a fundamental wave, a second harmonic, and a third harmonic, respectively) show characteristics of the conventional high frequency switch circuit 100. Note that the frequency of the fundamental wave is 60 GHz.

As is clear from FIG. 5B, it is found that both the second harmonic and the third harmonic in the high frequency switch circuit 10 in this embodiment are smaller than those in that of the prior art.

As shown in FIGS. 5A and 5B, it is found that the high frequency switch circuit 10 in this embodiment is improved in the distortion characteristics when a signal with high power is inputted, as compared to the prior art.

Next, another configuration example of the high frequency switch circuit in this embodiment will be described.

FIG. 6 is a diagram showing another circuit configuration example of the high frequency switch circuit in this embodiment. In FIG. 6, the same numerals and symbols are given to components having the same functions as those shown in FIG. 1, and description thereof is omitted.

A high frequency switch circuit 20 shown in FIG. 6 is different from the high frequency switch circuit 10 shown in FIG. 1 in that diodes 11a, 11b, 11c, and 11d are employed in place of the FETs 5a, 5b, 5c, and 5d.

Specifically, in the high frequency switch circuit 20, a cathode of the diode 11a is connected to an interconnection point between transmission lines 4a and 4b constituting one line of a balanced line pair, and an anode is connected to one electrode of a capacitor 12a. The other electrode of the capacitor 12a is connected to an interconnection point between transmission lines 4a' and 4b' constituting the other line of the balanced line pair. An interconnection point between the anode of the diode 11a and one electrode of the capacitor 12a is connected to a control terminal (CONT) 14a to which a control voltage is supplied via a resistor 13a.

Note that in the high frequency switch circuit 20, a set of diode, capacitor, and resistor is also connected and configured at each of portions using the diodes 11b, 11c, and 11d corresponding to the FETs 5b, 5c, and 5d of the high frequency switch circuit 10, similarly to that relating to the diode 11a, and therefore detailed description thereof is omitted. Further, the principle of operation and so on are the same as those in the high frequency switch circuit 10 shown in FIG. 1, and therefore description thereof will be omitted.

Figures 7, 8:
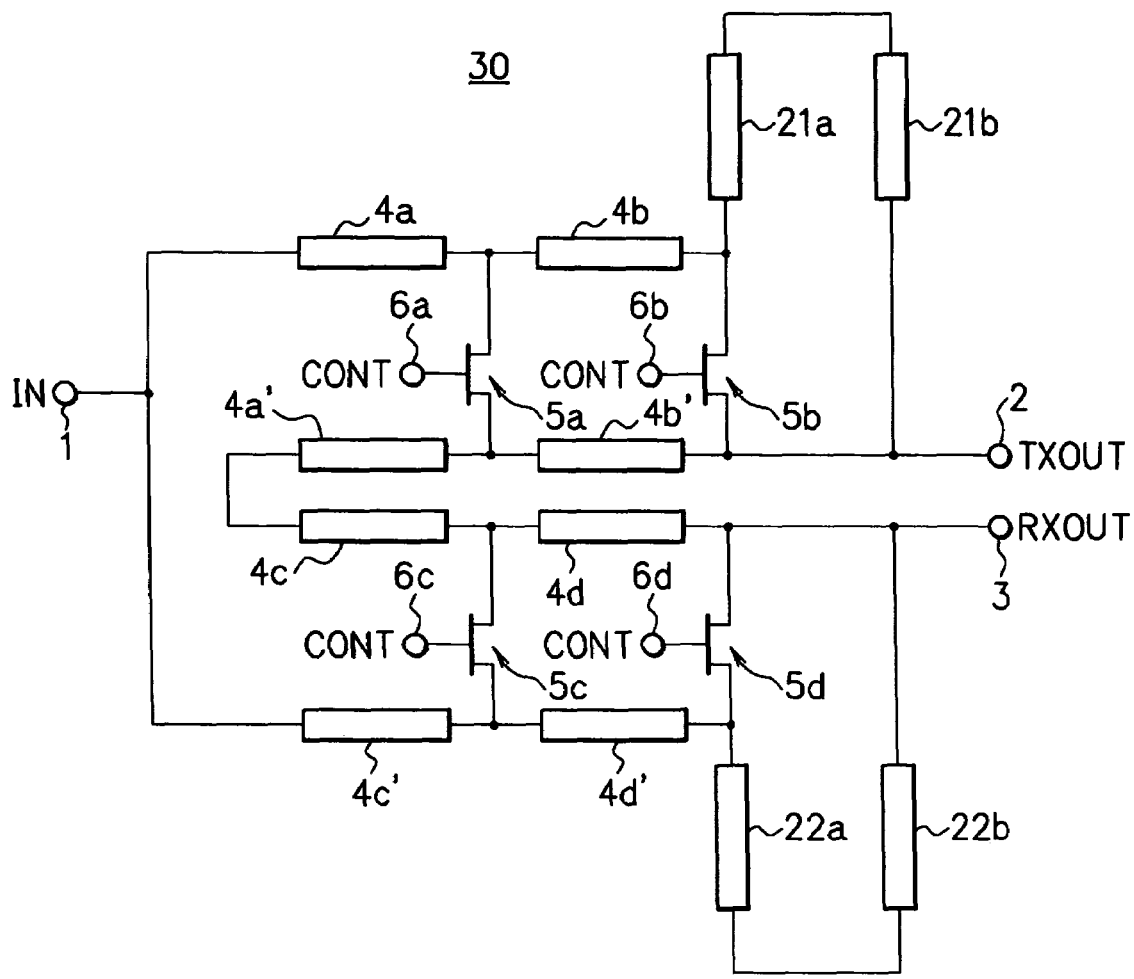
FIG. 7 is a diagram showing another circuit configuration example of the high frequency switch circuit in this embodiment.
FIG. 8 is a chart showing examples of the transistor applicable to the high frequency switch circuit in this embodiment.

FIG. 7 is a diagram showing another configuration example of the high frequency switch circuit in this embodiment. In FIG. 7, the same numerals and symbols are given to components having the same functions as those shown in FIG. 1, and duplicated description is omitted.

A high frequency switch circuit 30 shown in FIG. 7 is different from the high frequency switch circuit 10 shown in FIG. 1 in that an outputting side terminal is connected to a BALUN circuit. The high frequency switch circuit 30 shown in FIG. 7 has the BALUN circuit being a conversion circuit performing balanced/unbalanced conversion connected thereto and thereby can obtain an unbalanced signal on the outputting side.

On the transmitting side path of the high frequency switch circuit 30, transmission lines 21a and 21b each having an electric length of (λ/4) are connected in cascade between an interconnection point between a transmission line 4b and a drain of an FET 5b and an interconnection point between a transmission line 4b' and a source of the FET 5b. Further, an interconnection point between the transmission lines 4b' and 21b is connected to a transmitting side output terminal (TX-OUT) 2. Since the sum of the electric lengths of the transmission lines 21a and 21b is half length in this example, a signal (balanced signal) transmitted through the balanced transmission lines 4a, 4a', 4b, and 4b' is converted to an unbalanced signal.

On the other hand, on the receiving side path, transmission lines 22a and 22b each having an electric length of (λ/4) are connected in cascade between an interconnection point between a transmission line 4d' and a source of an FET 5d and an interconnection point between a transmission line 4d and a drain of the FET 5d respectively. Further, an interconnection point between the transmission lines 4d and 22b is connected to a receiving side output terminal (RXOUT) 3. Since the sum of the electric lengths of the transmission lines 22a and 22b is half length in this example, a signal (balanced signal) transmitted through the balanced transmission lines 4c, 4c', 4d, and 4d' is converted to an unbalanced signal.

Note that the principle of operation and so on of the high frequency switch circuit 30 are the same as those in the high frequency switch circuit 10 shown in FIG. 1, and therefore description thereof will be omitted here.

A list of transistors applicable as the FETs 5a to 5d used in the high frequency switch circuits 10 and 30 shown in FIG. 1 and FIG. 7 is shown in FIG. 8. In FIG. 8, symbols given to exemplified transistors indicate that the suitability lowers in the order of circle, triangle, and cross. As shown in FIG. 8, in the switch circuit in the embodiments, an HEMT (high electron mobility transistor) and an HBT (hetero-junction bipolar transistor) are applicable as a transistor element.

Figure 9:
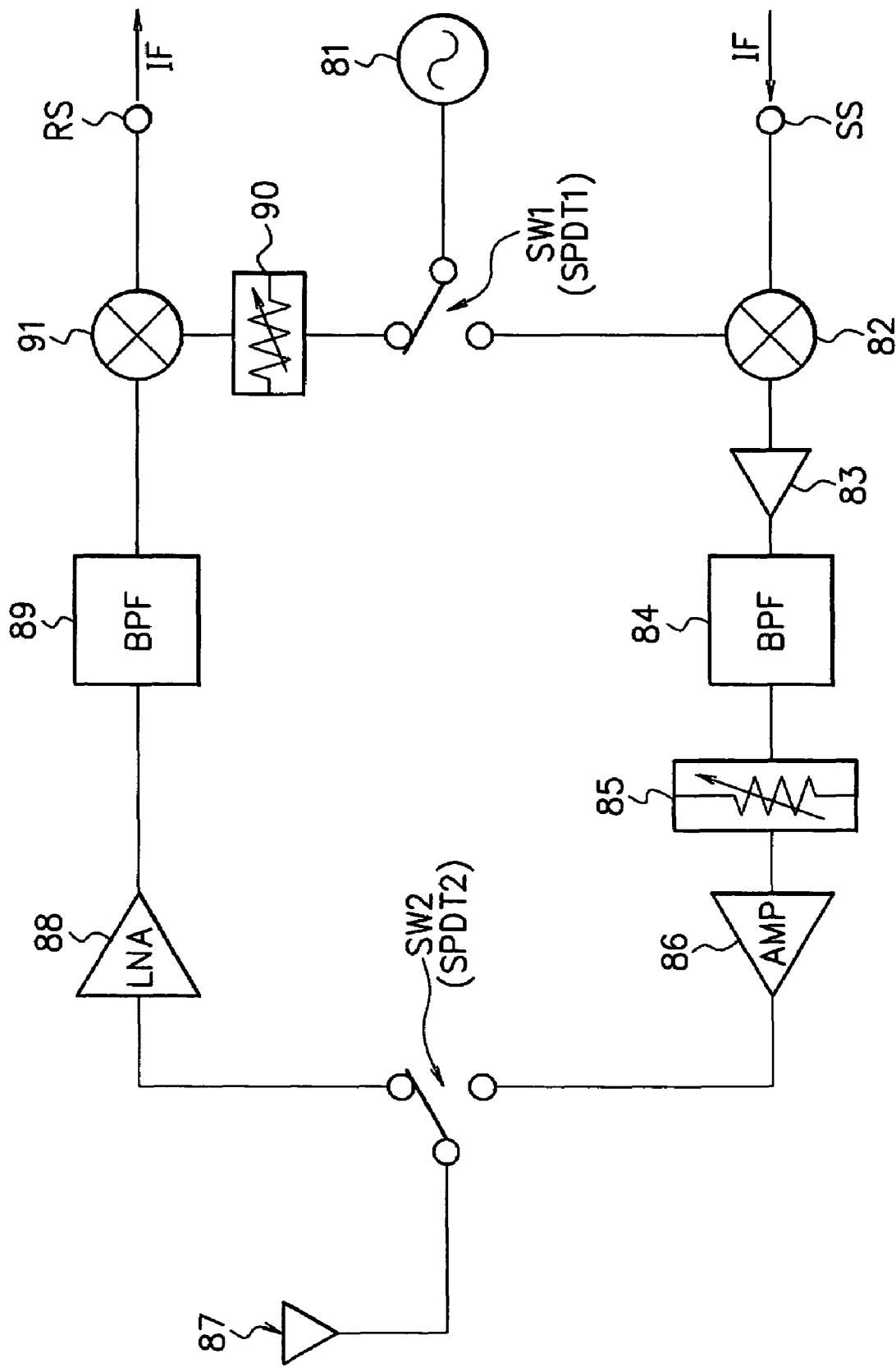
FIG. 9 is a diagram showing a configuration example of an integrated circuit of a transceiver apparatus using the high frequency switch circuit in this embodiment.

FIG. 9 is a diagram showing a configuration example of an integrated circuit of an RF (radio frequency signal) transceiver apparatus configured using a high frequency switch circuit in this embodiment.

In FIG. 9, numeral 81 denotes a high-power voltage controlled oscillator (VCO), 82 denotes a mixer (up-converter), 83 denotes a driver, 84 denotes a band-pass filter (BPF), 85 denotes a variable attenuator, 86 denotes a high-power amplifier (AMP), and 87 denotes a transmitting/receiving antenna. Further, numeral 88 denotes a low-noise amplifier (LNA), 89 denotes a band-pass filter (BPF), 90 denotes a variable attenuator, 90 denotes a variable attenuator, 91 denotes a mixer (down-converter), and SW1 and SW2 denote SPDT switches.

A transmission IF signal (intermediate frequency signal) inputted from a transmission signal input terminal SS is converted to a transmission RF signal (high frequency signal) by the up-converter 82 based on an oscillation signal of the high-power VCO 81 supplied via the switch SW1 (SPDT1). The transmission RF signal outputted from the up-converter 82 passes through the driver 83 and is subjected to filtering by the BPF 84 so that its unnecessary frequency components are cut.

The transmission RF signal outputted from the BPF 84 is attenuated at the variable attenuator 85 by a predetermined attenuation so that its output level is adjusted, and then amplified at the high-power amplifier 86. The transmission RF signal amplified at the high-power amplifier 86 is supplied to the transmitting/receiving antenna 87 via the switch SW2 (SPDT2) and transmitted from the transmitting/receiving antenna 87.

Since the transmission signal is required to have high power and small distortion here, the high frequency switch circuit in this embodiment is applied to the switch SW2 (SPDT2) placed in immediate proximity to the transmitting/receiving antenna 87. Note that the high frequency switch circuit in this embodiment may be applied to the switch SW1 (SPDT1).

A reception RF signal received by the transmitting/receiving antenna 87 is supplied to the low-noise amplifier 88 via the switch SW2 (SPDT2) and amplified at the low-noise amplifier 88. The reception RF signal amplified at the low-noise amplifier 88 is subjected to filtering at the BPF 84, and then supplied to the down-converter 91.

The reception RF signal supplied to the down-converter 91 is converted to a reception IF signal at the down-converter 91 based on a local oscillation signal based on the oscillation signal of the high-power VCO 81 and outputted from a reception signal output terminal RS.

Note that the switch circuit in the above-described embodiments can be configured as a monolithic integrated circuit in which FETs (transistors) constituting the switch circuit and transmission lines of ($\lambda$/4) are monolithically integrated on the same semiconductor substrate. The switch circuit can be configured as a hybrid integrated circuit in which active elements such as FETs in the switch circuit are integrated on a semiconductor substrate, passive elements such as transmission lines are integrated on a dielectric substrate, and the semiconductor substrate with the active elements integrated thereon and the dielectric substrate with the passive elements integrated thereon are incorporated therein.

According to the present invention, the inputted power is half on each balanced line as compared to the case using an unbalanced line as in the prior art, so that even if a high frequency signal with high power is inputted, a DC-like current can be prevented from flowing when the FET of the switch circuit is in an off state, so as to obtain excellent distortion characteristics.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A switch circuit, comprising:
    an unbalanced line having one end connected to an input terminal;
    a first balanced line connected between another end of said unbalanced line and a first output terminal; and
    a second balanced line connected between the other end of said unbalanced line and a second output terminal,
    each of said first and second balanced lines including:
    a plurality of quarter-wave transmission lines connected in cascade; and
    a plurality of controlled circuits, each of said controlled circuits being connected between one pair of transmission lines constituting said balanced line for each interconnection point between said quarter-wave transmission lines connected in cascade, and an impedance of said controlled circuit being controllable from outside.

2. The switch circuit according to claim 1, wherein each of said plurality of controlled circuits is a transistor element impedance-controlled by a control voltage supplied to a control electrode.

3. The switch circuit according to claim 1, wherein each of said plurality of controlled circuits is a field effect transistor having a gate electrode supplied with a control voltage, a drain electrode connected to one transmission line of the one pair of transmission lines, and a source electrode connected to another transmission line.

4. The switch circuit according to claim 2, wherein each of the transistor elements is an HEMT (high electron mobility transistor).

5. The switch circuit according to claim 2, wherein each of the transistor elements is an HBT (hetero-junction bipolar transistor).

6. The switch circuit according to claim 1, wherein each of said plurality of controlled circuits includes a diode with two terminals connected between the one pair of transmission lines.

7. The switch circuit according to claim 1, wherein each of said plurality of controlled circuits includes a diode with two terminals and a capacitor,
    the diode having a cathode connected to one transmission line of the one pair of transmission lines and an anode connected to another transmission line via the capacitor, and the anode being supplied with a control voltage.

8. The switch circuit according to claim 1, further comprising:
    a conversion circuit performing balanced/unbalanced conversion at least between said first balanced line and said first output terminal, and between said second balanced line and said second output terminal.

9. An integrated circuit, comprising:

a transmission signal processing circuit converting an intermediate frequency signal to a high frequency signal, amplifying the signal, and outputting the signal to an antenna;

a reception signal processing circuit supplied with the high frequency signal received by the antenna, amplifying the high frequency signal, and converting the signal to an intermediate frequency signal; and a switch circuit selectively connecting said transmission signal processing circuit or said reception signal processing circuit to the antenna in a manner to be able to transmit the signal thereto, wherein said switch circuit includes:

an unbalanced line having one end connected to the antenna;

a first balanced line connected between another end of the unbalanced line and said transmission signal processing circuit; and a second balanced line connected between the other end of the unbalanced line and said reception signal processing circuit, and each of the first and second balanced lines including:

a plurality of quarter-wave transmission lines connected in cascade; and a plurality of controlled circuits, each of the controlled circuits being connected between one pair of transmission lines constituting said balanced line for each interconnection point between said quarter-wave transmission lines connected in cascade, and an impedance of the controlled circuit being controllable from outside.

* * * * *